United States Patent
Baek

(10) Patent No.: US 8,917,555 B2
(45) Date of Patent: Dec. 23, 2014

(54) SEMICONDUCTOR DEVICE AND OPERATING METHOD THEREOF

(75) Inventor: Yong Mook Baek, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 324 days.

(21) Appl. No.: 13/455,439

(22) Filed: Apr. 25, 2012

(65) Prior Publication Data

US 2012/0275223 A1 Nov. 1, 2012

(30) Foreign Application Priority Data

Apr. 26, 2011 (KR) .................. 10-2011-0038987

(51) Int. Cl.
*G11C 16/10* (2006.01)
*G11C 16/12* (2006.01)
*G11C 16/06* (2006.01)
*G11C 16/34* (2006.01)
*G11C 16/04* (2006.01)

(52) U.S. Cl.
CPC ........ *G11C 16/3459* (2013.01); *G11C 16/0483* (2013.01); *G11C 16/10* (2013.01)
USPC ............ 365/185.18; 365/185.17; 365/185.24; 365/185.27; 365/185.28; 365/185.09

(58) Field of Classification Search
USPC ............. 365/185.17, 185.18, 185.24, 185.27, 365/185.28, 185.29, 185.09
See application file for complete search history.

(56) References Cited

U.S. PATENT DOCUMENTS

| | | | | |
|---|---|---|---|---|
| 6,567,312 B1 * | 5/2003 | Torii et al. | ................. | 365/185.28 |
| 6,744,675 B1 * | 6/2004 | Zheng et al. | ............. | 365/185.28 |
| 7,133,313 B2 * | 11/2006 | Shih | ......................... | 365/185.18 |
| 2002/0028547 A1 * | 3/2002 | Ryu et al. | ...................... | 438/200 |
| 2003/0103384 A1 * | 6/2003 | Takahashi | ................ | 365/185.28 |
| 2004/0130942 A1 * | 7/2004 | Yeh et al. | .................. | 365/185.01 |
| 2007/0036001 A1 * | 2/2007 | Kanda et al. | ............. | 365/185.18 |
| 2007/0183208 A1 * | 8/2007 | Tanaka et al. | ............ | 365/185.22 |
| 2008/0225595 A1 * | 9/2008 | Choi et al. | ............... | 365/185.19 |
| 2008/0291737 A1 * | 11/2008 | Moon et al. | .............. | 365/185.19 |
| 2009/0273978 A1 * | 11/2009 | Fukuda | .................... | 365/185.17 |
| 2010/0046300 A1 * | 2/2010 | Sarin et al. | ................ | 365/185.19 |

FOREIGN PATENT DOCUMENTS

KR  1020100056747  5/2010

OTHER PUBLICATIONS

Office Action issued from the Korean Intellectual Property Office on Sep. 14, 2012.

* cited by examiner

*Primary Examiner* — J. H. Hur
(74) *Attorney, Agent, or Firm* — IP & T Group LLP

(57) ABSTRACT

There is disclosed an operating method of a semiconductor device including programming a memory cell by supplying a program voltage to a control gate of the memory cell and a detrap voltage to a well which is formed in a semiconductor substrate, and subsequently removing electrons trapped in a tunnel insulating layer of the memory cell by supplying a voltage lower than the detrap voltage to the control gate while also supplying the detrap voltage to the well before the programmed memory cell is verified.

16 Claims, 4 Drawing Sheets

Program

Detrap

SEMICONDUCTOR DEVICE AND OPERATING METHOD THEREOF

CROSS-REFERENCE TO RELATED APPLICATION

Priority to Korean patent application number 10-2011-0038987 filed on Apr. 26, 2011, the entire disclosure of which is incorporated by reference herein, is claimed.

BACKGROUND

Exemplary embodiments relate to a semiconductor device and an operating method thereof and, more particularly, to a detrap method in a program operation.

A semiconductor device includes a plurality of memory cells for storing data. To store data in the memory cells, a program operation is performed. In the program operation, some electrons may be trapped in a specific layer, and the trapped electrons are capable of deteriorating an electrical characteristic of the memory cells. This electron trapping phenomenon is described below with reference to FIG. 1.

FIG. 1 is a cross-sectional view of a memory cell illustrating the features of a conventional program operation.

Referring to FIG. 1, the memory cell includes a tunnel insulating layer 13, a charge trap layer 14, a dielectric layer 15, and a control gate 16 sequentially stacked over a semiconductor substrate 11. Junctions 12 are formed in the semiconductor substrate 11 on both sides of the memory cell. The junctions 12 are formed within a well formed in the semiconductor substrate 11, and the tunnel insulating layer 13 and the well partially overlap with each other. The charge trap layer 14 is also called a floating gate. The control gate 16 is coupled to a word line WL. The tunnel insulating layer 13 is formed of an oxide layer. The charge trap layer 14 and the control gate 16 are formed of conductive layers (for example, polysilicon layers). The dielectric layer 15 has a stack structure including a high dielectric layer (or an oxide layer), a nitride layer, and an oxide layer.

A program operation on the memory cells is performed by supplying a program voltage to the word line WL when a program permission voltage (for example, 0 V) is supplied to the well and bit lines. When the high program voltage is supplied to the word line WL, some of electrons in the well move to the charge trap layer 14 via the tunnel insulating layer 13 by means of Fowler-Nordheim (FN) tunneling. The programmed memory cells have different threshold voltages according to the amount of electrons trapped in the charge trap layer 14. When the threshold voltage of a specific memory cell reaches a target level, the memory cell corresponds to a programmed cell. When the threshold voltage of the memory cell is lower than the target level, the memory cell corresponds to a non-programmed (or erase) cell.

A read operation on memory cells is performed by supplying a read voltage to a word line WL coupled to the memory cells. The state of the memory cell may be determined according to whether the threshold voltage of the memory cell is higher or lower than the read voltage.

As described above, the data of the memory cells is determined by the threshold voltages of the memory cells, and the threshold voltage of the memory cell is determined by the number of electrons trapped in the charge trap layer 14 (more specifically, the number of programmed electrons).

In a program operation, however, some electrons may be trapped in the tunnel insulating layer 13 without passing into the charge trap layer 14. The threshold voltage of the memory cell may be shifted by the electrons trapped in the tunnel insulating layer 13. In particular, an electrical characteristic of the tunnel insulating layer 13 is gradually deteriorated as program, erase, and read operations are repeatedly performed. Accordingly, the number of electrons trapped in the tunnel insulating layer 13 may be increased according to an increase in the number of operations on the semiconductor device.

BRIEF SUMMARY

According to exemplary embodiments, in a program operation, a program voltage and a detrap voltage are supplied to a word line and a well, respectively, at the same time, but the detrap voltage is supplied for a longer time than the program voltage. Accordingly, electrons trapped in a tunnel insulating layer can be removed at the time of a program operation.

According to an aspect of the present disclosure, there is provided an operating method of a semiconductor device, comprising: programming a memory cell by supplying a program voltage to a control gate of the memory cell and a detrap voltage to a well which is formed in a semiconductor substrate; and subsequently removing electrons trapped in a tunnel insulating layer of the memory cell by supplying a voltage lower than the detrap voltage to the control gate while also supplying the detrap voltage to the well before the programmed memory cell is verified.

An operating method of a semiconductor device according to another aspect of this disclosure includes programming selected memory cells by supplying a program voltage to a selected word line, a pass voltage to unselected word lines, and a detrap voltage to a well, wherein the program voltage is higher than the pass voltage, and the pass voltage is higher than the detrap voltage; and subsequently supplying a voltage lower than the detrap voltage to the selected word line and the unselected word lines while also supplying the detrap voltage to the well before a verify operation on the memory cells is performed.

A semiconductor device according to yet another aspect of this disclosure includes a memory cell array including a plurality of memory blocks; a voltage supply circuit configured to supply a program voltage to a selected word line, a pass voltage to unselected word lines, and a detrap voltage to a well, wherein the program voltage is higher than the pass voltage, and the pass voltage is higher than the detrap voltage; and a control circuit configured to control the voltage supply circuit so that the program voltage, the pass voltage, and the detrap voltage are supplied to the selected word line, the unselected word lines, and the well, respectively, in a program operation and subsequently supply a voltage lower than the detrap voltage to the selected word line and the unselected word lines while also supplying the detrap voltage to the well before a program verify operation.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
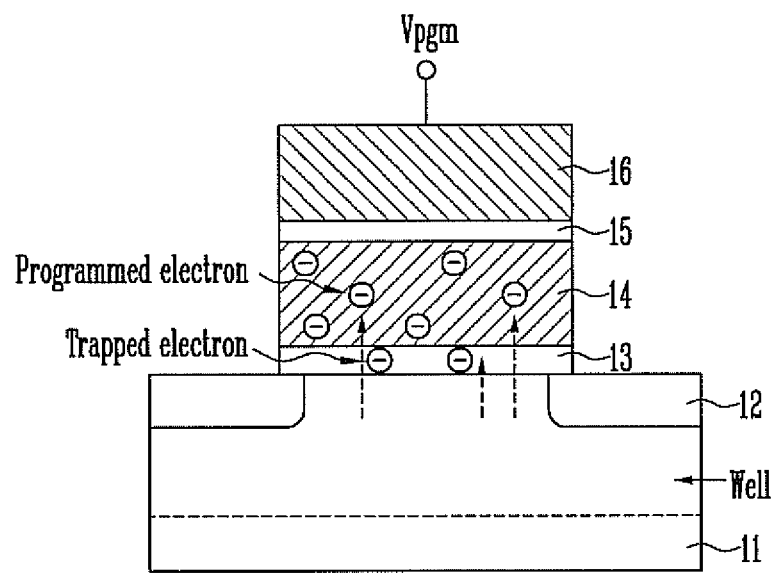
FIG. 1 is a cross-sectional view of a memory cell for illustrating the features of a conventional program operation.
Figure 2:
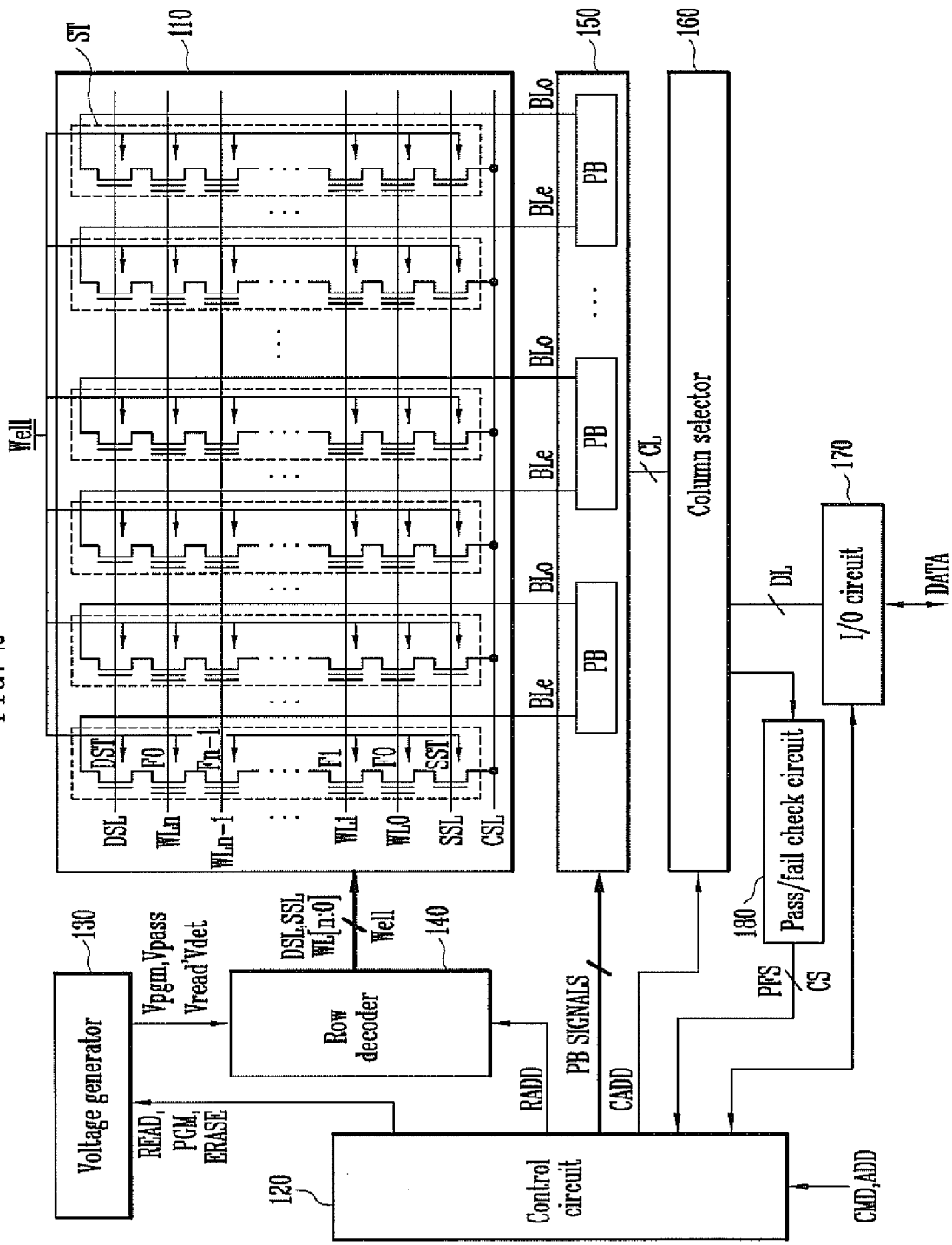
FIG. 2 is a block diagram of a semiconductor device for illustrating a programming method according to this disclosure.

FIG. 2 is a block diagram of a semiconductor device for illustrating a programming method according to this disclosure.

Referring to FIG. 2, the semiconductor device includes a memory cell array 110, a circuit group (130, 140, 150, 160, 170, and 180) for performing a program, read, or erase operation on memory cells included in the memory cell array 110, and a control circuit 120 for controlling the circuit group (130, 140, 150, 160, 170, and 180) to set the threshold voltages of memory cells according to input data.

For example, in a NAND flash memory device, the circuit group may include a voltage generator 130, a row decoder 140, a page buffer group 150, a column selector 160, an I/O circuit 170, and a pass/fail check circuit 180.

The memory cell array 110 includes a plurality of memory blocks. One of the memory blocks is shown in FIG. 2. The memory block includes a plurality of strings ST commonly coupled to a well Well. Some of the strings ST are designated as normal strings, and some of the strings ST are designated as flag strings. The strings ST have the same construction.

Each of the strings ST includes a source select transistor SST coupled to a common source line CSL, a plurality of memory cells F0 to Fn, and a drain select transistor DST coupled to bit lines BLe and BLo. A memory cell included in the flag string is called a flag cell, but the flag cell has the same construction as other memory cells included in the strings ST. The gate of the source select transistor SST is coupled to the source select line SSL, the gates of the memory cells F0 to Fn are coupled to respective word lines WL0 to WLn, and the gate of a drain select transistor DST is coupled to a drain select line DSL. The strings ST are coupled to the relevant bit lines BLe and BLo and are coupled to the common source line CSL.

The control circuit 120 internally generates a program operation signal PGM, a read operation signal READ, or an erase operation signal ERASE in response to a command signal CMD and also generates page buffer signals PB SIGNALS for controlling the page buffers of the page buffer group 150 according to a type of an operation. In particular, in a program operation, the control circuit 120 supplies a program voltage and a detrap voltage to a word line and the well, respectively, at the same time, but supplies the detrap voltage for a longer time than the program voltage. Here, the detrap voltage is supplied to the well to extract electrons, which are trapped in the tunnel insulating layers of the memory cells, toward a semiconductor substrate.

Furthermore, the control circuit 120 generates a row address signal RADD and a column address signal CADD in response to an address signal ADD. At the time of a program or erase verify operation, the control circuit 120 also checks whether the threshold voltages of the memory cells have risen to a target level in response to a check signal CS generated by the pass/fail check circuit 180 and determines whether to perform a program or erase operation again, and whether a program or erase operation has been completed or failed according to a result of the check.

The voltage supply circuit (130, 140) supplies voltages necessary for the program operation, the read operation, or the erase operation of memory cells to the drain select line DSL, the word lines WL0 to WLn, the source select line SSL of a memory block, and the well in response to the signals PGM, ERASE, READ, and RADD of the control circuit 120. The voltage supply circuit includes the voltage generator 130 and the row decoder 140.

The voltage generator 130 outputs operating voltages for programming, reading, or erasing memory cells to global lines in response to the operating signals PGM, READ, and ERASE (more specifically, the internal command signals) of the control circuit 120. When the memory cells are programmed, the voltage generator 130 supplies the global lines with an operating voltage (for example, Vpgm, Vpass, Vread or Vdet) for a program. Vpgm refers to a program voltage, Vpass refers to a pass voltage, Vread refers to a read voltage, and Vdet refers to a detrap voltage.

The row decoder 140 transfers the operating voltages of the voltage generator 130 to the local lines DSL, SSL, and WL[n:0] of a memory block and the well in response to the row address signals RADD of the control circuit 120.

The page buffer group 150 detects a program state or an erase state of memory cells. The page buffer group 150 includes the page buffers coupled to the bit lines BLe and BLo and supplies voltages necessary to store data in the memory cells F0 to Fn to the bit lines BLe and BLo in response to the page buffer signals PB SIGNALS of the control circuit 120.

More particularly, in the program operation, the erase operation, or the read operation of the memory cells F0 to Fn, the page buffer group 150 precharges the bit lines BLe and BLo or latches data corresponding to threshold voltages of the memory cells F0 to Fn that are detected according to a shift in the voltages of the bit lines BLe and BLo. More specifically, in the program operation, the page buffer group 150 supplies a program permission voltage (for example, a ground voltage) or a program inhibition voltage (for example, Vcc) to the bit lines BLe or BLo according to the latched data. In the read operation, page buffer group 150 controls the voltages of the bit lines BLe to BLo according to data stored in the memory cells F0 to Fn and detects data stored in the memory cells F0 to Fn. Furthermore, the page buffer group 150 supplies an erase permission voltage (for example, Vcc) to the bit lines BLe and BLo in the early stage of the erase operation and supplies the program permission voltage (for example, the ground voltage) to the bit lines BLe and BLo coupled to a string ST erased in a program operation performed according to an erase verification result during the erase operation.

The column selector 160 selects the page buffers of the page buffer group 150 in response to the column address signal CADD of the control circuit 120. Data latched in a page buffer selected by the column selector 160 is outputted. Furthermore, the column selector 160 receives data, which is outputted from the page buffer group 150, via a column line CL and transfers the data to the pass/fail check circuit 180.

The I/O circuit 170 transfers external data DATA to the column selector 160 under the control of the control circuit 120 to input the data DATA to the page buffers of the page buffer group 150 in a program operation. When the column selector 160 sequentially transfers the data DATA to the page buffers of the page buffer group 150, the page buffers store the data DATA in latches. Furthermore, in a read operation, the I/O circuit 170 externally outputs the data DATA, which is received from the page buffers of the page buffer group 150, via the column selector 160.

The pass/fail check circuit 180 checks whether there is an error cell during a verify operation performed after a program or erase operation and outputs a result of the verify operation in the form of a check signal PFC. The pass/fail check circuit 180 also counts the number of error cells and outputs a result of the counting error cells in the form of a count signal CS.

The control circuit 120 controls a level of a program voltage supplied to a word line in the program operation of the memory cells and controls the voltage generator 130 so that verify voltages can be selectively supplied to the word line in a program verify operation. In some embodiments, the control circuit 120 may control the voltage generator 130 according to the check signal CS of the pass/fail check circuit 180.

A programming method of memory cells using the semiconductor device is described below.

Figure 3:
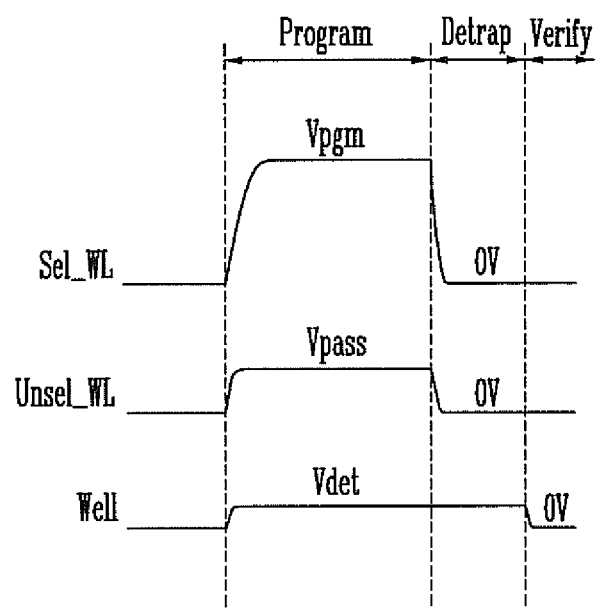
FIG. 3 is a timing diagram illustrating the programming method according to this disclosure.

FIG. 3 is a timing diagram illustrating the programming method according to this disclosure.

The programming method is described below with reference to FIGS. 3 and 2.

1 Program Period

When the program period starts, in the state where a program permission voltage (for example, a ground voltage) has been supplied to selected bit lines and a program inhibition voltage (for example, Vcc) has been supplied to unselected bit lines, the program voltage Vpgm, the pass voltage Vpass, and the detrap voltage Vdet are supplied to a selected word line Sel_WL (more specifically, any one of the word lines WL0 to WLn), unselected word lines Unsel_WL (more specifically, the remaining word lines other than the selected word line), and a well (Well of FIG. 4A), respectively, at the same time.

The program voltage Vpgm is a voltage for programming selected memory cells, the pass voltage Vpass is a voltage for forming a channel in the strings ST, and the detrap voltage Vdet is a voltage for removing electrons trapped in regions other than the charge trap layers (for example, the floating gates) of the selected memory cells. In this program period, the detrap voltage Vdet is supplied to the well Well simultaneously with the program voltage Vpgm supplied to the selected word line Sel_WL so that electrons trapped in a subsequent detrap period can be easily removed rather than removing the trapped electrons in the program period. As an example to prevent program efficiency from deteriorating by the detrap voltage Vdet supplied to the well Well in the program period, the program voltage Vpgm and the pass voltage Vpass may be raised by the detrap voltage Vdet.

In particular, to maintain electrons trapped in the charge trap layers of the memory cells, but to selectively remove electrons trapped in regions other than the charge trap layers (more specifically, the tunnel insulating layers) in the program operation, the detrap voltage Vdet has a positive voltage lower than the pass voltage Vpass. For example, the detrap voltage Vdet may be 0.1 V to 0.5 V. In this example, each of the program voltage Vpgm and the pass voltage Vpass may be raised by 0.1 V to 0.5 V as compared with the program voltage Vpgm and the pass voltage Vpass when the detrap voltage is not applied. Accordingly, in the program period, the memory cells are programmed without a reduction in program efficiency. More specifically, electrons are trapped in the charge trap layer (104 of FIG. 4A) of the memory cell, and thus the memory cell is programmed. By applying the program voltage Vpgm and the pass voltage Vpass to the memory cells, some of the electrons may also be trapped in the tunnel insulating layer (103 of FIG. 4A) of the memory cell.

Furthermore, in the program period of FIG. 3, when the detrap voltage Vdet is supplied to the well Well, the program voltage Vpgm and the pass voltage Vpass are supplied to the selected word line Sel_WL and the unselected word lines Unsel_WL, respectively, at the same time. However, the method of supplying the program voltage Vpgm and the pass voltage Vpass to the selected word line Sel_WL and the unselected word lines Unsel_WL, respectively, in the state where the detrap voltage Vdet has been supplied to the well Well may be changed in various ways according to a programming method. For example, when the detrap voltage Vdet is supplied to the well Well, the pass voltage Vpass may be supplied to the selected word line Sel_WL and the unselected word lines Unsel_WL at the same time, and subsequently a voltage of the selected word line Sel_WL may be raised up to the program voltage Vpgm.

2 Detrap Period

When the detrap period starts after the program period, the program voltage Vpgm and the pass voltage Vpass are no longer applied to the word lines Sel_WL and Unsel_WL, respectively, but the detrap voltage Vdet is still supplied to the well Well. More specifically, if the detrap voltage Vdet continues to be supplied to the well in the state where the voltages of all the word lines Sel_WL and Unsel_WL have become lower than the detrap voltage Vdet, electrons trapped in the tunnel insulating layer 103 of the memory cell exits to the well Well (more specifically, a semiconductor substrate 101). Accordingly, electrons trapped in the tunnel insulating layer 103, from among the electrons introduced into the memory cell, can be selectively removed. However, the electrons trapped in the charge trap layer 104 of the memory cell may remain intact because the detrap voltage Vdet has a low voltage, for example, 0.1 V to 0.5 V.

After the detrap period finishes, the voltage of the well drops to the ground voltage, and the verify operation of the selected memory cells is performed (more specifically, a verify period).

Unlike in the programming method of the present embodiment, the detrap voltage Vdet may not be supplied to the well Well when the program voltage Vpgm is supplied, but may be supplied after the supply of the program voltage Vpgm is stopped. In this example, the time taken to perform a program operation is increased. For this reason, as shown in FIG. 3, the detrap voltage Vdet is supplied simultaneously with the program voltage Vpgm, but the detrap voltage Vdet is supplied for a longer time than the program voltage Vpgm. In this embodiment, a detrap operation can be performed in a short time.

Figure 4A:
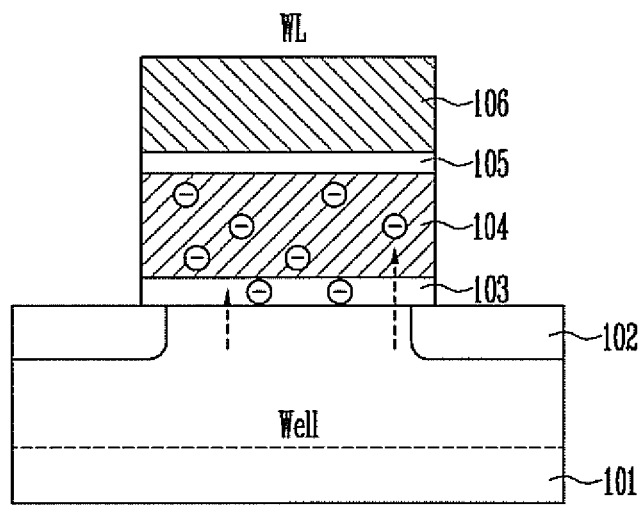
FIGS. 4A and 4B a cross-sectional view of a memory cell for illustrating the features of the programming method according to this disclosure.
Figure 4B:
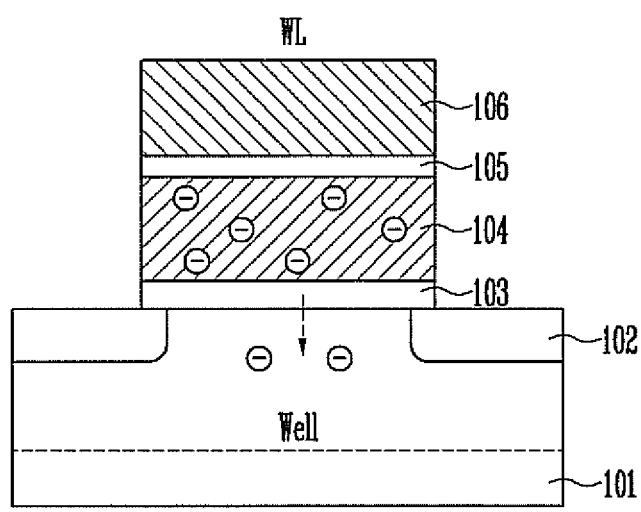

FIGS. 4A and 4B a cross-sectional view of the memory cell for illustrating the effects of the programming method according to this disclosure.

A basic structure of a NAND memory cell is shown in FIG. 4A. The NAND memory cell includes a tunnel insulating layer 103, a charge trap layer 104, a dielectric layer 105, and a control gate 106, which are sequentially stacked over a semiconductor substrate 101 formed in a well Well. Junctions 102 (more specifically, a source and a drain) are formed in the semiconductor substrate 101 on both sides of the memory cell.

The tunnel insulating layer 103 may be formed of an oxide layer. The charge trap layer 104 and the control gate 106 may be formed of a conductive layer (for example, a polysilicon layer). The dielectric layer 105 may be formed of a high dielectric layer or a stack structure, which includes an oxide layer, a nitride layer, and an oxide layer. The charge trap layer 104 is also called a floating gate. The control gate 106 is coupled to the word line WL, and part of the tunnel insulating layer 103 adjoins the well Well. In the program period of FIG. 3, when the program voltage Vpgm is supplied to the selected word line Sel_WL, some of electrons included in the well Well tunnel through tunnel insulating layer 103 by means of FN tunneling, and the tunneling electrons are then trapped in the charge trap layer 104. In this example, some of the electrons do not move from the tunnel insulating layer 103 to the charge trap layer 104 and may be trapped in the tunnel insulating layer 103.

Referring to FIGS. 4B and 3, in the detrap period, the voltages of all the word lines Sel_WL and Unsel_WL are lower than the detrap voltage Vdet, and the detrap voltage Vdet continues to supplied to the well Well. Thus, the electrons trapped in the tunnel insulating layer 103 may selectively exit to the semiconductor substrate 101. More specifically, in the detrap period, the electrons trapped in the floating gate 104 remain intact, and the electrons trapped in the tunnel insulating layer 103 selectively exit to the semiconductor substrate 101.

In this disclosure, the NAND memory cell has been described as an example. However, the program operation of supplying the detrap voltage Vdet as described above may also be applied to other memory cell structures, such as an SONOS structure. Thus, in a program verify operation or a read operation subsequent to the program operation, whether memory cells have been programmed can be determined based on, for example, the electrons trapped in the charge trap layers 104. Accordingly, a semiconductor device may be more reliable.

As described above, in the program operation, the program voltage and the detrap voltage are supplied to the selected word line and the well, respectively, at the same time, and the detrap voltage is supplied for a longer time than the program voltage. Accordingly, electrons trapped in the tunnel insulating layer can be removed within a short time. Furthermore, since electrons trapped in the tunnel insulating layer are removed, program, read, and erase operations may be more reliable.

What is claimed is:

1. An operating method of a semiconductor device, comprising:
    programming a memory cell by supplying a program voltage to a control gate of the memory cell and a detrap voltage to a well which is formed in a semiconductor substrate, wherein the detrap voltage has a positive voltage lower than the program voltage; and
    subsequently removing electrons trapped in a tunnel insulating layer of the memory cell by supplying a voltage lower than the detrap voltage to the control gate while also supplying the detrap voltage to the well before the programmed memory cell is verified.

2. The operating method of claim 1, wherein the detrap voltage is 0.1 V to 0.5 V.

3. The operating method of claim 1, wherein the program voltage is increased by the detrap voltage.

4. The operating method of claim 1, wherein supplying the voltage lower than the detrap voltage to the control gate includes supplying a ground voltage to the control gate in a state where the detrap voltage is being supplied to the well.

5. The operating method of claim 1, further comprising verifying the memory cell by lowering the voltage applied to the well after removing the electrons trapped in the tunnel insulating layer.

6. The operating method of claim 5, wherein lowering the voltage of the well includes supplying a ground voltage to the well.

7. An operating method of a semiconductor device, comprising:
    programming selected memory cells by supplying a program voltage to a selected word line, a pass voltage to unselected word lines, and a detrap voltage to a well, wherein the program voltage is higher than the pass voltage, and the pass voltage is higher than the detrap voltage; and
    subsequently supplying a voltage lower than the detrap voltage to the selected word line and the unselected word lines while also supplying the detrap voltage to the well before a verify operation on the memory cells is performed.

8. The operating method of claim 7, wherein the detrap voltage has a positive voltage lower than pass voltage.

9. The operating method of claim 7, wherein the detrap voltage is 0.1 V to 0.5 V.

10. The operating method of claim 7, wherein each of the program voltage and the pass voltage is increased by the detrap voltage.

11. The operating method of claim 7, further comprising performing a verify operation by supplying a ground voltage to the well after a voltage lower than the detrap voltage is supplied to the selected word line and the unselected word lines in a state where the detrap voltage is being supplied to the well.

12. The operating method of claim 7, further comprising:
    supplying a program permission voltage to selected bit lines coupled to the selected memory cells, wherein the program permission voltage is a voltage supplied to perform a program, erase, or read operation on the selected memory cells and
    supplying a program inhibition voltage to remaining unselected bit lines, wherein the program inhibition voltage is a voltage supplied to prevent performing a program, erase, or read operation on the unselected memory cells.

13. The operating method of claim 12, wherein:
    the program permission voltage is a ground voltage, and
    the program inhibition voltage is a power source voltage.

14. A semiconductor device, comprising:
    a memory cell array including a plurality of memory blocks;
    a voltage supply circuit configured to supply a program voltage to a selected word line, a pass voltage to unselected word lines, and a detrap voltage to a well, wherein the program voltage is higher than the pass voltage, and the pass voltage is higher than the detrap voltage; and
    a control circuit configured to control the voltage supply circuit so that the program voltage, the pass voltage, and the detrap voltage are supplied to the selected word line, the unselected word lines, and the well, respectively, in a program operation and subsequently supply a voltage lower than the detrap voltage to the selected word line and the unselected word lines while also supplying the detrap voltage to the well before a program verify operation.

15. The semiconductor device of claim 14, wherein the voltage supply circuit comprises:
    a voltage generator configured to generate the program voltage, the pass voltage, and the detrap voltage in response to control signals of the control circuit; and
    a row decoder configured to supply the voltages of the voltage generator to the selected word line, the unselected word lines, and the well.

16. The semiconductor device of claim 15, further comprising:
    a page buffer group including a plurality of page buffers and configured to supply a program permission voltage or a program inhibition voltage to a memory block, selected from the memory blocks, under a control of the control circuit wherein the program permission voltage is a voltage supplied to perform a program, erase, or read operation on the selected memory cells, and the program inhibition voltage is a voltage supplied to prevent performing a program, erase, or read operation on the unselected memory cells;
    a column selector configured to select the page buffers; and
    an input/output (I/O) circuit configured to transfer data to the column selector.

* * * * *